(12) United States Patent
Kennedy et al.

(10) Patent No.: US 8,693,212 B1
(45) Date of Patent: Apr. 8, 2014

(54) CHASSIS COVER HAVING OPTICAL OPEN-CLOSE DETECTOR

(75) Inventors: Brian D. Kennedy, Rutland, MA (US); Antonio L. Fontes, Northbridge, MA (US)

(73) Assignee: EMC Corporation, Hopkinton, MA (US)

( * ) Notice: Subject to any disclaimer, the term of this patent is extended or adjusted under 35 U.S.C. 154(b) by 289 days.

(21) Appl. No.: 12/882,234

(22) Filed: Sep. 15, 2010

(51) Int. Cl.
*H05K 7/02* (2006.01)
(52) U.S. Cl.
USPC .......................................... 361/807; 361/753
(58) Field of Classification Search
USPC ................................................ 361/807, 753
See application file for complete search history.

(56) References Cited

U.S. PATENT DOCUMENTS 7,196,316 B2 * 3/2007 Chan et al. ................... 250/221
2009/0260925 A1 * 10/2009 Schilling ...................... 187/269
2010/0006649 A1 * 1/2010 Bolton ......................... 235/386

* cited by examiner

*Primary Examiner* — Yuriy Semenenko
(74) *Attorney, Agent, or Firm* — Krishnendu Gupta; Konrad R. Lee

(57) ABSTRACT

A chassis having a cover moveable between open and closed positions and circuitry for detecting whether the cover is in the open or the closed position. The circuitry includes a transmitter of optical energy disposed at a fixed position within the chassis for transmitting pulses of optical energy at a predetermined frequency and a receiver for optical energy disposed at a fixed position within the chassis. A reflector is mounted to an inner surface of the cover and is disposed in a path to intercept and then reflect the intercepted transmitted energy to the receiver when the cover is moved to the closed position and being disposed away from the path to prevent the transmitted energy to be intercepted and then reflected to the receiver when the cover is moved to the open position. The detection circuitry indicates whether the cover is in either the open or the closed position selectively in accordance with whether the transmitted energy is reflected to the receiver is above or below a predetermined threshold level and whether at said predetermined frequency.

3 Claims, 1 Drawing Sheet

CHASSIS COVER HAVING OPTICAL OPEN-CLOSE DETECTOR

TECHNICAL FIELD

This disclosure relates generally to chassis cover open-close detectors.

BACKGROUND

As is known in the art, it is frequency desirable to detect whether a cover for a chassis storing electrical components is in an open position or a closed position. One such chassis is used to store an array of disk drives used, for example, in a data storage system. Knowledge of proper closing is important to enable proper cooling of the electrical components stored in the chassis.

Previous approaches used a mechanical switch to detect that the top cover is open. Mechanical switches however are inherently less reliable because they have moving parts. One-approach uses a cable to connect this switch to their logic PCBs. Cables and their connectors, however, reduce shock and vibration reliability.

SUMMARY

In accordance with the present disclosure, a chassis is provided for storing in an interior of the chassis electrical components. The chassis has a cover moveable between an open position and a closed position and circuitry for detecting whether the cover is in the open position or the closed position. The circuitry includes a transmitter of optical energy disposed at a fixed position within the chassis, such transmitter transmitting pulses of optical energy at a predetermined frequency. The circuitry also includes a receiver for optical energy disposed at a fixed position within the chassis. A reflector is mounted to an inner surface of the cover, such reflector being disposed in a path to intercept and then reflect the intercepted transmitted optical energy to the receiver when the cover is moved to the closed position and being disposed away from the path to prevent the transmitted optical energy to be intercepted and then reflected to the receiver when the cover is moved to the open position. The receiver includes detection circuitry for indicating whether the cover is in either the open position or the closed position selectively in accordance with whether the transmitted optical energy is reflected to the receiver.

In one embodiment, the detection circuitry indicates whether the cover is in either the open position or the closed position selectively in accordance with whether the transmitted optical energy is reflected to the receiver is above or below a predetermined threshold level.

In one embodiment, the detection circuitry indicates whether the cover is in either the open position or the closed position selectively in accordance with whether the transmitted optical energy reflected to the receiver at said predetermined frequency.

In one embodiment, the detection circuitry indicates whether the cover is in either the open position or the closed position selectively in accordance with whether the transmitted optical energy is reflected to the receiver is above or below a predetermined threshold level and whether the transmitted optical energy reflected to the receiver at said predetermined frequency.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

Like reference symbols in the various drawings indicate like elements.

DETAILED DESCRIPTION

Figure 1A:
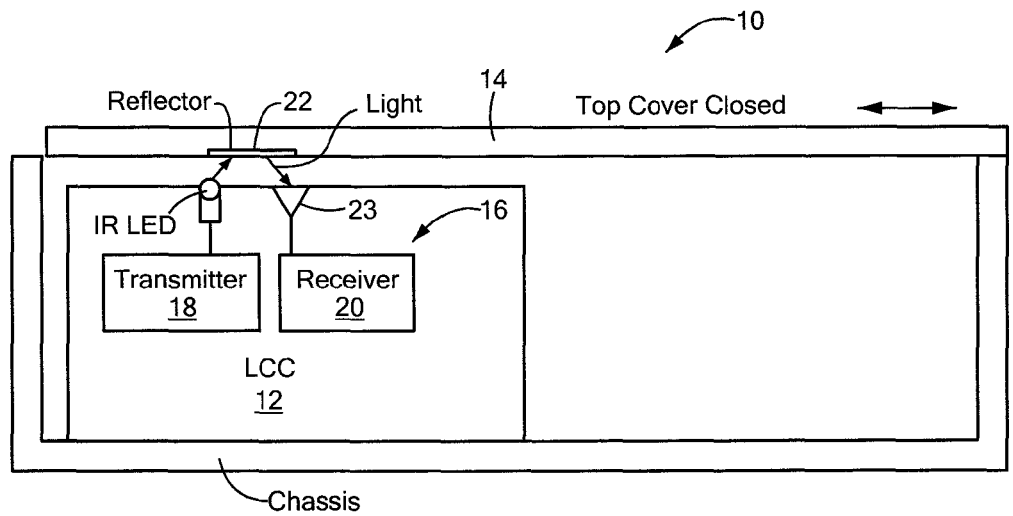
FIG. 1A is a diagram of a chassis having a cover in a closed position and having circuitry for detecting whether the cover is in the closed or open position.
Figure 1B:
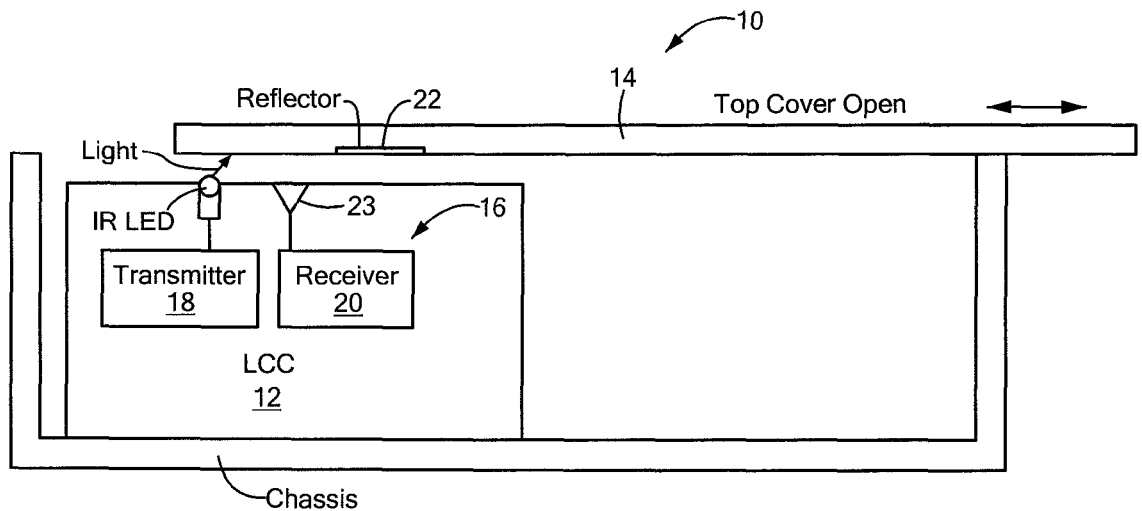
FIG. 1B is a diagram of the chassis of FIG. 1A having the cover in an open position and having the circuitry for detecting whether the cover is in the closed or open position.

Referring now to FIGS, A and 1B, a chassis 10 is shown for storing in an interior of the chassis 10 electrical components 12, here disk drives and associated circuitry. The chassis 10 has a cover 14 moveable (here slidable) between an open position (FIG. 1B) and a closed position (FIG. 1A) and circuitry 16 for detecting whether the cover 14 is in the open position or the closed position. The circuitry 16 includes a transmitter 18 of optical energy, here infrared energy as with, for example, a Light Emitting Diode (LED) 19, disposed at a fixed position within the chassis 10, such transmitter 18 transmitting pulses of optical energy at a predetermined frequency. The circuitry 16 also includes a receiver 20 for optical energy disposed at a fixed position within the chassis 10. A reflector 22 is mounted to an inner surface of the cover 14, such reflector 22 being disposed in a path to intercept and then reflect the intercepted transmitted optical energy to the receiver when the cover is moved to the closed position (as shown in FIG. 1A) and being disposed away from the path to prevent the transmitted optical energy to be intercepted and then reflected to the receiver when the cover is moved to the open position (as shown in FIG. 1B).

The receiver 20 includes optical energy detection circuitry fed by, in this example, a photo detecting transistor 23, for indicating whether the cover 14 is in either the open position or the closed position selectively in accordance with whether the transmitted optical energy is reflected to the receiver 20 and sensed by the photo detecting transistor 23.

Figure 2:
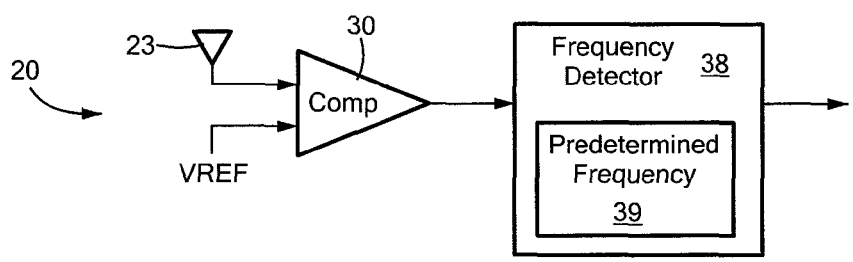
FIG. 2 is a block diagram of the circuitry of FIGS. 1A and 1B for detecting whether the cover is in the closed or open position.

More particularly, and referring to FIG. 2, the detection circuitry 16 indicates whether the cover 14 is in either the open position or the closed position selectively in accordance with whether the transmitted optical energy is reflected to the receiver 20 is above or below a predetermined threshold level. Here, the output of the photo-detecting transistor 23 is fed to one input of a comparator 30. The other input to the comparator is fed a predetermined threshold reference voltage, VREF. If the output of the photo-detecting transistor 23 is below the predetermined threshold reference voltage, VREF (i.e., when the cover 14 is not in the closed position) a constant (i.e., zero frequency) low voltage, here near 0 volts is produced at the output of the comparator 30.

If, on the other hand, the cover 14 is in the closed position, a train of pulses will be produced by the output of the photo detecting transistor 23 having amplitudes greater than the predetermined threshold reference voltage, VREF and the output of the comparator 30 will also be a train of pulses having the same frequency as the predetermined frequency of the pulses produced by the transmitter 18.

The output of the comparator 30 is fed to a frequency detector 38. Stored in logic, 39, for example, the frequency detector 38 is the predetermined frequency of the transmitted pulses. The frequency detector 38 determines in any conventional manner the frequency of the signal produced by the comparator 30. One technique is to detect leading edges of the signal produced by the comparator 30 and to count the number of transitions (e.g., high to low transitions) in a predetermined period of time. The computed frequency is then compared with the stored predetermined frequency of the transmitted pulses. If the computed frequency and the stored frequency are the same, then an indication of a close cover position is provided by the output of the frequency detector 38. Thus, the cover is considered closed only if the pulses exceed threshold and have proper frequency. Otherwise it is considered not closed and thus open.

A number of embodiments of the disclosure have been described. Nevertheless, it will be understood that various modifications may be made without departing from the spirit and scope of the disclosure. Accordingly, other embodiments are within the scope of the following claims.

What is claimed is:

1. A chassis for storing in an interior of the chassis electrical components, such chassis having a cover moveable between an open position and a closed position and circuitry for detecting whether the cover is in the open position or the closed position, such circuitry comprising:
    a transmitter of light disposed at a fixed position within the chassis, such transmitter transmitting light as a train of pulses at a predetermined frequency;
    a receiver for light disposed at a fixed position within the chassis;
    a reflector mounted to an inner surface of the cover, such reflector being disposed in a path to intercept and then reflect intercepted transmitted light to the receiver when the cover is moved to the closed position and being disposed away from the path to prevent the transmitted light to be intercepted and then reflected to the receiver when the cover is moved to the open position; and
    wherein the receiver includes a frequency detection circuit for indicating whether the cover is in either the open position or the closed position selectively in accordance with whether the transmitted light is reflected to and received at the receiver at the predetermined frequency of the train of pulses.

2. The chassis recited in claim 1 wherein the the receiver includes a comparator wherein the comparator determines whether the transmitted light is reflected to the receiver at above or below a predetermined threshold level.

3. A chassis for storing in an interior of the chassis electrical components, such chassis having a cover moveable between an open position and a closed position and circuitry for detecting whether the cover is in the open position or the closed position, such circuitry comprising:
    a transmitter of light disposed at a fixed position within the chassis, such transmitter transmitting light as a train of pulses at a predetermined frequency;
    a receiver for light disposed at a fixed position within the chassis;
    a reflector mounted to an inner surface of the cover, such reflector being disposed in a path to intercept and then reflect intercepted transmitted light to the receiver when the cover is moved to the closed position and being disposed away from the path to prevent the transmitted light to be intercepted and then reflected to the receiver when the cover is moved to the open position; and
    wherein the receiver includes a frequency detection circuit for indicating whether the cover is in either the open position or the closed position selectively in accordance with whether the transmitted light is reflected to and received at the receiver at a predefined threshold and at the predetermined frequency of the train of pulses.

\* \* \* \* \*